(12) United States Patent
Hsieh

(10) Patent No.: US 6,274,503 B1
(45) Date of Patent: Aug. 14, 2001

(54) ETCHING METHOD FOR DOPED POLYSILICON LAYER

(75) Inventor: Chi-Kuo Hsieh, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/241,757

(22) Filed: Feb. 1, 1999

(30) Foreign Application Priority Data

Dec. 18, 1998 (TW) .................................................. 87121150

(51) Int. Cl.$^7$ ........................ H01L 21/302; H01L 21/461
(52) U.S. Cl. ........................ 438/734; 438/587; 438/714; 438/735
(58) Field of Search .................................. 438/696, 705, 438/714, 735, 734, 738, 587

(56) References Cited

U.S. PATENT DOCUMENTS

| | | | |
|---|---|---|---|
| 4,528,066 | * | 7/1985 | Merkling, Jr. et al. .............. 438/696 |
| 5,665,203 | * | 9/1997 | Lee et al. ............................ 438/585 |
| 6,103,603 | * | 8/2000 | Han ..................................... 438/532 |
| 6,124,212 | * | 9/2000 | Fan et al. ............................ 438/709 |

* cited by examiner

Primary Examiner—Stephen D. Meier
Assistant Examiner—Jamie L. Brophy
(74) Attorney, Agent, or Firm—Jiawei Huang; J.C. Pantents

(57) ABSTRACT

A method for etching a doped polysilicon layer. A first doped polysilicon layer of a first conductive type and a second doped polysilicon layer of a second conductive type are formed. An etching process is performed to pattern the first doped polysilicon layer and the second doped polysilicon layer. The etching process includes a first main etching step and a second main etching step. The etching pressure of the first main etching step is lower than the etching pressure of the second main etching step.

26 Claims, 4 Drawing Sheets

ETCHING METHOD FOR DOPED POLYSILICON LAYER

CROSS-REFERENCE TO RELATED APPLICATION

This application claims the priority benefit of Taiwan application serial no. 87121150, filed Dec. 18, 1998, the full disclosure of which is incorporated herein by reference.

BACKGROUND OF THE INVENTION

1. Field of the Invention

The present invention relates to a semiconductor fabricating method. More particularly, the present invention relates to a method of etching a doped polysilicon layer.

2. Description of the Related Art

Progress in semiconductor fabrication technologies has made it possible to fabricate semiconductor devices at the deep sub-micron level. In deep sub-micron semiconductor technology, the required gate sizes are specifically small and the required operation voltages are high. Thus, gate material has to be improved in order to maintain gate stability. However, reduction size of the gate may cause a short channel effect to occur. A dual gate comprises gates of different conductive types. Because the dual gate has good control ability to withstand the short channel effect, it has become widely used in a gate fabricating process with a linewidth of about 0.25 micro meter to 0.18 micro meter.

An N-type polysilicon gate and a P-type polysilicon gate are both employed in the dual gate structure. Therefore, it is desired to etch simultaneously an N-type polysilicon layer and a P-type polysilicon layer during an etching process to form a dual gate. Due to different doping concentrations and different conductive types of the N-type polysilicon layer and the P-type polysilicon layer, the etching rates of the N-type polysilicon layer and the P-type polysilicon layer are different. The different etching rates cause significantly high etching bias on the N-type polysilicon layer the P-type polysilicon layer, which significantly increases risks of device failure.

Reference is made to FIG. 1, which explains a dual gate formed by etching a doped polysilicon layer having an N-type polysilicon gate and a P-type polysilicon gate. The devices represented by each number are as follows: a substrate 100, an isolation structure 102, an N-well 104, a P-well 106, a gate oxide layer 108, a P-type polysilicon gate 110, and an N-type polysilicon gate 112.

The etching rate of the N-type polysilicon is higher than the etching rate of the P-type polysilicon, which easily leads to an etching bias. As shown in FIG. 1, after the etching process, the gate oxide layer 108 beside the N-type polysilicon gate 112 is exposed after etching, whereas the undesired portions of the P-type polysilicon gate 110 still remain to cover a portion of the gate oxide layer 108. The P-type polysilicon gate 110 is etched to leave thin edge portions of the P-type polysilicon gate 110 that covers the gate oxide layer 108. The sidewall profile of the P-type polysilicon gate 110 is different from a desired profile, which is called an etching bias, because of the remaining undesired edge portions of the P-type polysilicon gate 110. The etching bias may further cause critical dimension bias (CD bias) and reduce device integration.

If the etching step is performed until the P-type polysilicon gate 110 is completely removed, it is easy to over-etch the gate oxide layer 108 beside the N-type polysilicon gate 112. Once the N-type polysilicon gate 112 is over-etched, it is possible to punchthrough the gate oxide layer 108 beside N-type polysilicon gate layer 112. The gate oxide layer 108 may be etched until it is thin enough to form pits therein. Thus, the remaining gate oxide layer 108 is not sufficient to protect the substrate in the subsequent steps. It becomes especially serious for a fabricating process with a linewidth below 0.18 micro meter, in which the thickness of the gate oxide layer is only about 35 angstroms.

SUMMARY OF THE INVENTION

The invention provides an etching method for a doped polysilicon layer. The etching method is suitable for simultaneously etching a first doped polysilicon layer of a first conductive type and a second doped polysilicon layer of a second conductive type. A first main etching step (ME1) is performed with a first pressure on the first doped polysilicon layer and the second doped polysilicon layer. A second main etching step (ME2) is performed with a second pressure on the first remaining doped polysilicon layer and the second remaining doped polysilicon layer. The first pressure is lower than the second pressure. An over-etching step is performed after the second main etching step. Furthermore, a breakthrough etching step can be performed before the first main etching step. A bombardment step can also be performed between the breakthrough etching step and the first main etching step.

In a further aspect of the invention, the etching method of the invention can be applied to a method of fabricating a dual gate. A gate oxide layer is formed on a substrate. A doped polysilicon layer is formed on the gate oxide layer. The doped polysilicon layer has a first doped polysilicon layer of a first conductive type and a second doped polysilicon layer of a second conductive type. A first main etching step is performed with a first pressure on the first doped polysilicon layer and the second doped polysilicon layer. A second main etching step is performed with a second pressure on the remaining first doped polysilicon layer and the remaining second doped polysilicon layer to form a first doped polysilicon gate and a second doped polysilicon gate. Furthermore, a breakthrough etching step can be performed before the first main etching step. A bombardment step can also be performed between the breakthrough etching step and the first main etching step.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
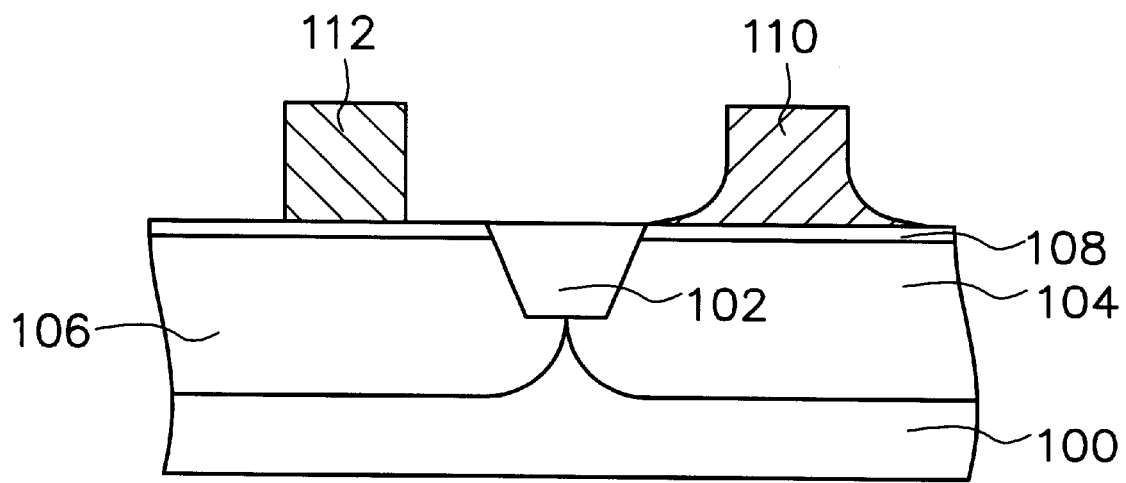
FIG. 1 is a schematic, cross-sectional view showing a conventional dual gate.

Reference will now be made in detail to the present preferred embodiments of the invention, examples of which are illustrated in the accompanying drawings. Wherever possible, the same reference numbers are used in the drawings and the description to refer to the same or like parts.

Because doped polysilicon layers of different conductive types have different etching rates, an etching bias easily occurs during etching. The etching bias may further induce critical dimension bias. Thus, the present invention reduces the etching difference between the doped polysilicon layers with doped polysilicon layers having different conductive types, such as an NMOS (N-type metal oxide semiconductor) and a PMOS (P-type metal oxide semiconductor), incorporated in a dual gate to solve the etching bias problem.

Reference is made to Table. 1, which lists a variety of etching factors under certain conditions for doped polysilicon layers with different conductive types, such as an NMOS and a PMOS. The factors include etching pressure, bias power, and gas flow rates. In Table 1, ER stands for etch ratio, which is the ratio of NMOS etching rate to PMOS etching rate. When the etching ratio of the NMOS and PMOS is close to 1, the etching bias is correspondingly lowered.

TABLE 1

| Run Number | Pressure (mTorr) | Bias power (Wt) | He and O$_2$ (sccm) | Cl$_2$ and HBr (sccm) | ER (NMOS/PMOS) |
|---|---|---|---|---|---|
| 1 | 20 | 150 | 3 | 0.7 | 1.64 |
| 2 | 10 | 150 | 3 | 0.7 | 1.31 |
| 3 | 20 | 180 | 3 | 0.7 | 1.56 |
| 4 | 20 | 150 | 7 | 0.7 | 1.53 |
| 5 | 20 | 150 | 3 | 1.57 | 1.60 |
| 6 | 4 | 180 | 7 | 0.7 | 1.15 |

In comparison with the Run numbers 3, 4, and 6, the etching ratio is closer to 1 when the etching pressure is lowered. When the etching ratio is close to 1, the etching bias is lowered. Thus, in order to reduce etching bias, a high etching pressure is required.

However, difficulty is encountered when trying to determine the etching pressure. A high etching pressure is advantageous to the high etching selectivity. Specifically, etching selectivity between polysilicon and silicon oxide is lowered as the etching pressure is reduced. Thus, it causes the etching step to be hard to control and a gate oxide layer can easily be over-etched.

Accordingly, the present invention provides an etching process on a doped polysilicon layer in order to resolve the difficulty in determining etching pressure. The etching process includes main etching steps as follows. A first etching main step is performed with a specific low pressure, such as a first pressure. With the first pressure, the etching ratio between the two polysilicon layers with different conductive types is close to 1. In this first etching main step, the etching bias is effectively reduced. Once the polysilicon layer is etched to a certain thickness, a second etching main step is performed with a specific high pressure, such as a second pressure. In the second etching step, the etching selectivity between the polysilicon layers is increased. In the second etching step, the oxide layer is prevented from being over-etched or further pitted. The first pressure is lower than the second pressure. The preferred embodiment takes a dual gate fabricating process with a linewidth below 0.18 micro meter for example to further describe the above description in detail, as follows.

FIGS. 2A through 2E are schematic, cross-sectional views showing a fabricating method of a dual gate according to one preferred embodiment of the invention.

Figure 2A:
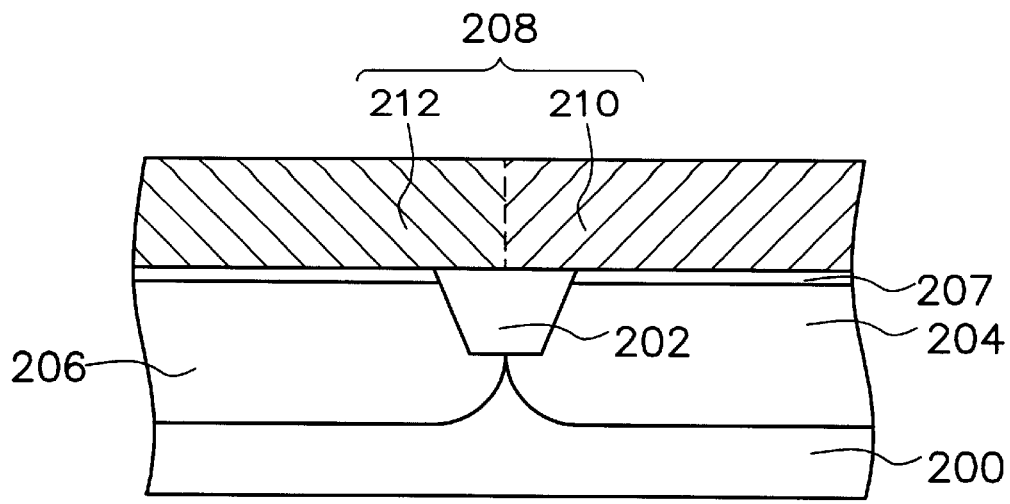
FIGS. 2A through 2E are schematic, cross-sectional views showing a fabricating method for a dual gate according to one preferred embodiment of the invention.

In FIG. 2A, an N-well 204 and a P-well 206 are formed in a semiconductor substrate 200. An isolation structure 202, such as a shallow trench isolation (STI), is formed in the substrate 200 between the N-well 204 and the P-well 206. The isolation structure 202 isolates the N-well 204 and the P-well 206 from each other. A gate oxide layer 207 is formed on the substrate 200. The gate oxide layer 207 can be formed by, for example, thermal oxidation. A doped polysilicon layer 208 is formed on the gate oxide layer 207. The doped polysilicon layer 208 includes a P-type polysilicon layer 210 and a N-type polysilicon layer 212. The P-type polysilicon layer 210 is doped with P-type dopants, such as boron (B) ions, arsenic (As) ions, or other suitable dopants. The N-type polysilicon layer 212 is doped with N-type dopants, such as nitrogen (N) ions, phosphorus (P) ions, or other suitable dopants.

The doped polysilicon layer 208 can be formed by, for example, first forming an undoped polysilicon layer (not shown) over the substrate 200 and then separately performing an ion implantation step for N-type dopants and an ion implantation step for P-type dopants. Or, the doped polysilicon layer 208 can be formed in situ, in a process such as separately depositing the P-type polysilicon layer 210 and the N-type polysilicon layer 212 over the substrate 200.

Figure 2B:
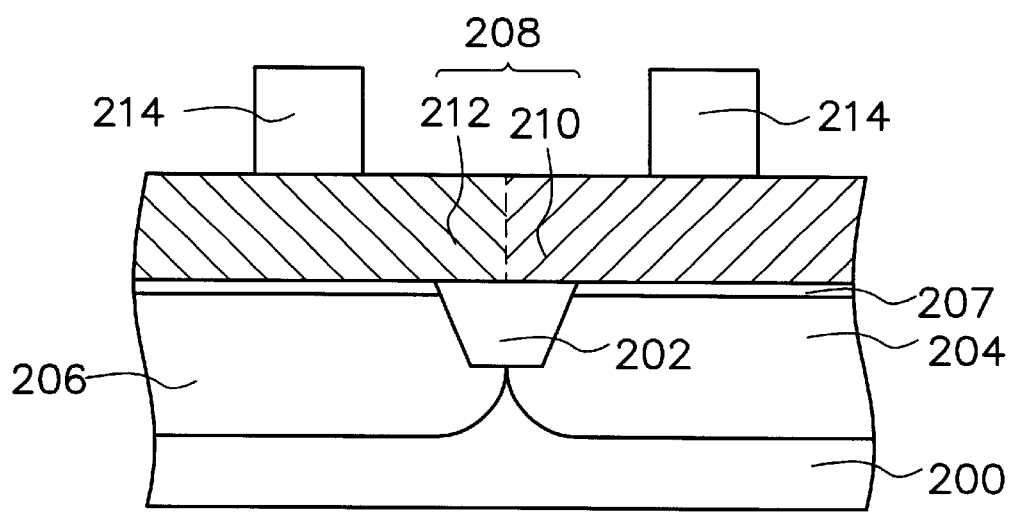

In FIG. 2B, a patterned mask layer 214 is formed on the doped polysilicon layer 208. The mask layer 214 covers specific regions, such as regions for forming a dual gate (shown in FIG. 2E). The mask 214, such as a photoresist layer, can be formed by, for example, a conventional photolithographic process.

Figure 2C:
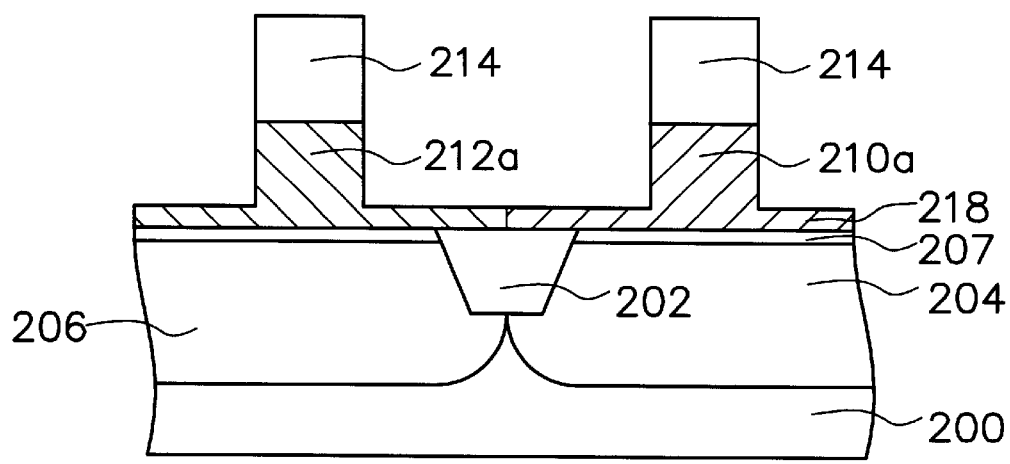

In FIG. 2C, an etching process is performed with the mask layer 214 serving as a mask. The etching process includes a first main etching ME1 step 305 and a second main etching ME2 step 307 (shown in FIG. 3). The etching process preferably is an anisotropic etching process, such as a dry etching process with a flow rate ratio of helium (He) to oxygen (O$_2$) from about 7:3 to 3:7, a flow rate of He and O$_2$ from about 3 sccm to 7 sccm, and a flow rate of a reaction gas mixture of Cl$_2$ and HBr from about 0.7 sccm to 1.57 sccm. The doped polysilicon layer 208 is patterned to form a remaining doped polysilicon layer 218. The remaining doped polysilicon layer 218 comprises a P-type polysilicon layer 210a, which remains from the P-type polysilicon layer 210, and an N-type polysilicon layer 212a, which remains from the N-type polysilicon layer 212.

Figure 3:
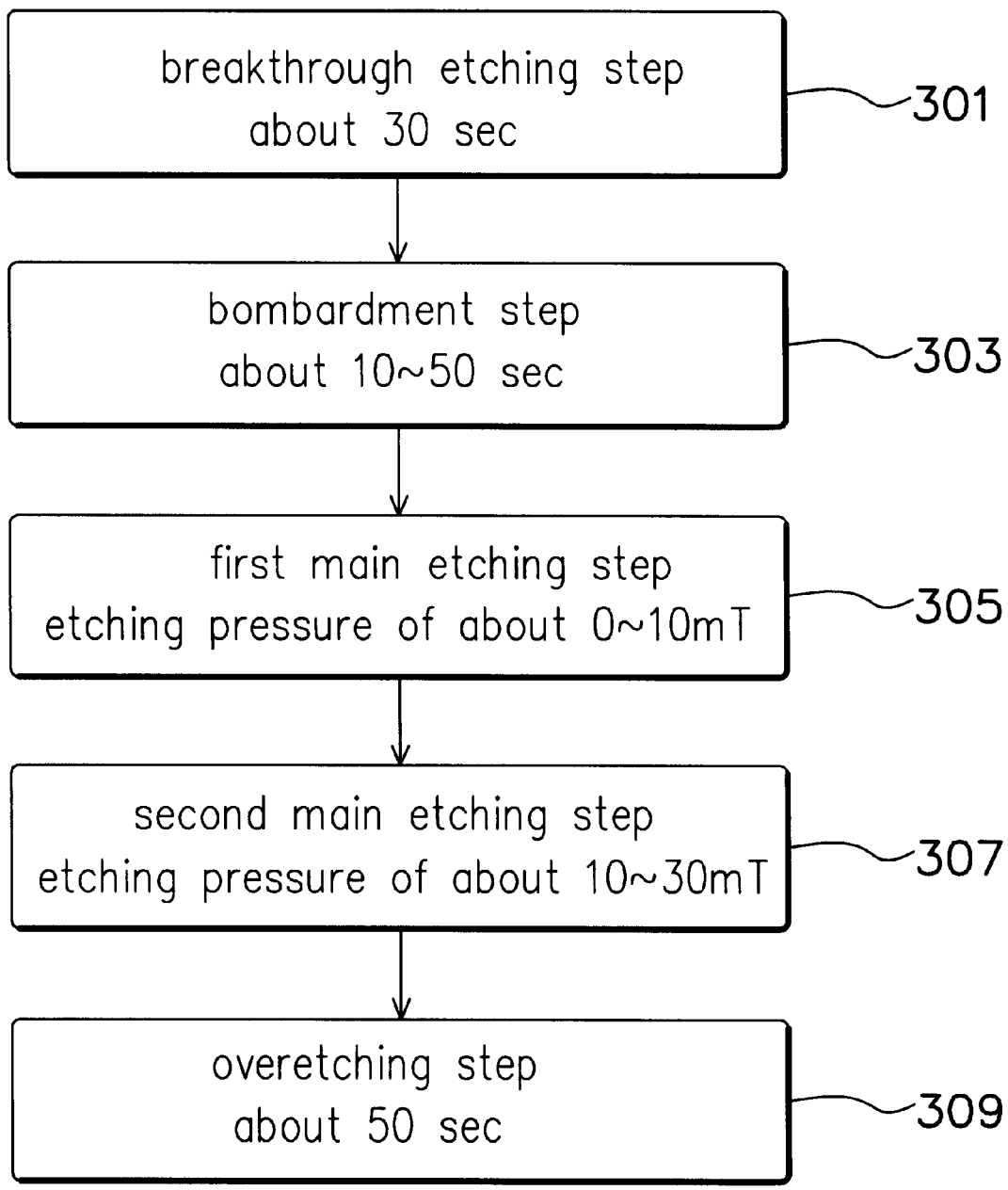
FIG. 3 is a flowchart of an etching method for doped polysilicon according to one preferred embodiment of the invention.

The etching process described in FIG. 2B and FIG. 2C is again described in detail in FIG. 3. In FIG. 3, a breakthrough (BT) etching process 301 is performed. The native oxide layer (not shown) on the doped polysilicon layer 208 is removed. Typically, the predetermined time for the breakthrough etching step 301 preferably is about 30 seconds. The etching pressure preferably is about 10 mTorr to 30 mTorr.

A bombardment step 303 is performed on the doped polysilicon layer 208 (shown in FIG. 2B). The bombardment step 303 can be performed with, for example, a C$_2$F$_6$ flow rate of about 50 sccm to 200 sccm, a pressure of about 10 mTorr to 30 mTorr, and a bombardment time of about 10 to 50 seconds. The C$_2$F$_6$ forms a polymer on the sidewalls of the P-type polysilicon layer 210 and the N-type polysilicon layer 212 during the bombardment step 303. The polymer formed by C$_2$F$_6$ equally prevents the sidewall of the P-type polysilicon layer 210 and the sidewall of the N-type polysilicon layer 212 from being etched. Thus, this bombardment step further induces etching uniformity of the P-type polysilicon layer 210 and the N-type polysilicon layer 212. If desired, the bombardment step can be omitted in consideration of limited facilities and budget. The purpose of the invention still reduces bias etching without performing the bombardment step.

A first main etching 305 is performed with a pressure of about 0 mTorr to 10 mTorr until the thickness of the remaining polysilicon layer 218 (shown in FIG. 2C) is decreased to about 10% to 40% of the thickness of the polysilicon layer 208 (shown in FIG. 2B). With this pressure of about 0 mTorr to 10 mTorr, the etching rates of the P-type polysilicon layer 210 and the N-type polysilicon layer 212 are close. Thus, a uniform etching rate is obtained.

Figure 2D:
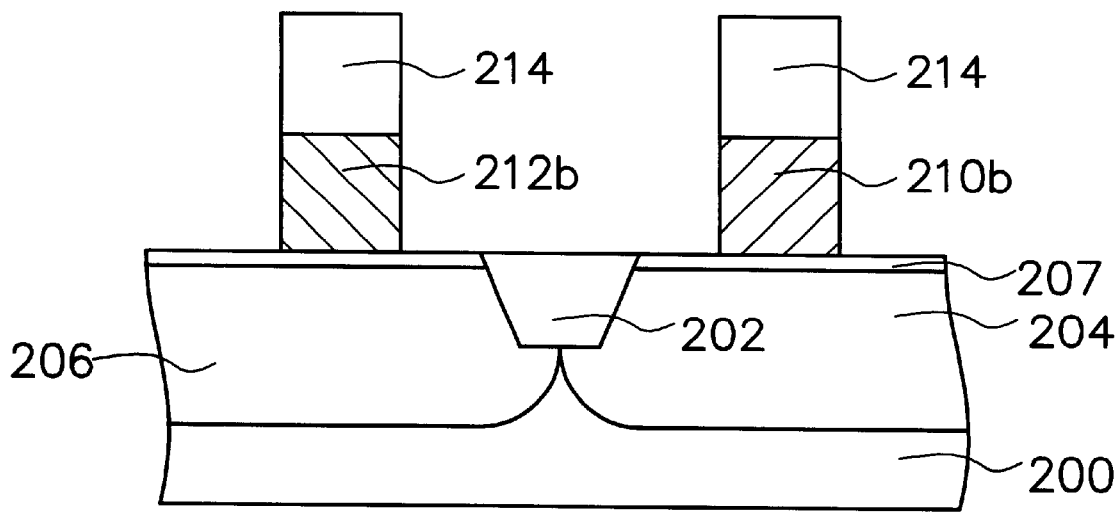

Referring to FIG. 2D and FIG. 3, a second main etching step 307 is performed with a pressure of about 10 mTorr to 30 mTorr. The remaining polysilicon layer 218 is removed until the gate oxide layer 207 is exposed to form a P-type polysilicon gate 210b and a N-type polysilicon gate 212b. With the second pressure, the etching selectivity between the remaining P-type polysilicon layer 210a and the remaining N-type polysilicon layer 212a is high. The gate oxide layer 207 is not over-etched. The pitted gate oxide layer arising from the conventional method is not formed in the present invention.

An over-etching (OE) step 309 (shown in FIG. 3) is performed with a pressure of about 30 mTorr to 100 mTorr. The polysilicon residue (not shown) is removed. The over-etching time preferably is about 50 seconds.

Figure 2E:
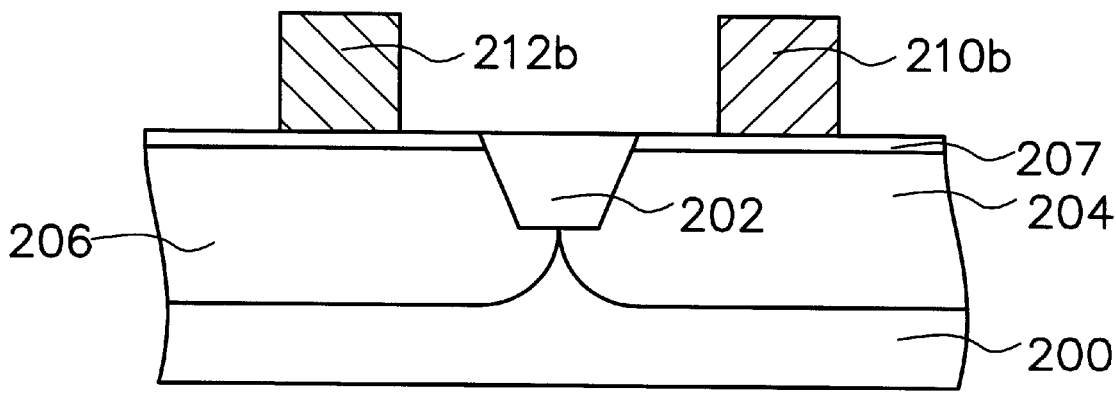

The mask layer 214 is removed to form a dual gate structure as shown in FIG. 2E. The mask layer 214 can be removed according to conventional steps. It is appreciated that the steps for removing the mask layer are well known to those skilled in the art, so these steps are not here described in detail.

With reference to Table 2, in the present invention, the etching time for the first main etching step 305 is performed until the thickness of remaining doped polysilicon layer 218 is about 10% to 40% of the thickness of the doped polysilicon layer 208. That is, when the doped polysilicon layer 208 is removed by 10% to 40%, the etching step is stopped. The etching time can be determined according to the thickness of the doped polysilicon layer 208. When the first main etching step 305 is performed for a predetermined time, the etching step is stopped and then a second main etching step 307 is performed. In the preferred embodiment, the etching time for the first main etching step 305 preferably is about 53 seconds. With the etching time of about 53 seconds, the bias etch is significantly reduced. The second main etching step 307 uses an end point detection system to determine the etching stop point. The gate oxide layer 207 can serve as an etching stop layer. Once the gate oxide layer 207 is detected by the end point detection system, the second main etching step is stopped. Then, the over-etching step 309 is performed after the second main etching step 307.

TABLE 2

| Step | BT | ME1 | ME2 | OE |
|---|---|---|---|---|
| Etching time | 30 seconds | depending on thickness of the doped polysilicon layer | end point detecting | 50 seconds |
| Etching pressure | Low pressure | Lowest pressure | High pressure | Highest pressure |

In summary, the invention has the following advantages:

1. The invention used an etching process. The etching process includes a first main etching step and a second main etching step.

2. In the invention, a first main etching step is first performed to lower etching bias.

3. A second main etching step is performed to induce etching selectivity between gate oxide and polysilicon. The second etching step protects a gate oxide layer from pit formation.

4. The invention provides a bombardment step before the first main etching step. The etching bias can be further reduced by the bombardment step.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. An etching method for a doped polysilicon layer, wherein the doped polysilicon layer comprises a first doped polysilicon layer of a first conductive type and a second doped polysilicon layer of a second conductive type, comprising the steps of:

performing a first main etching step with a first pressure on the first doped polysilicon layer and the second doped polysilicon layer, so as to leave a first remaining doped polysilicon layer and a second remaining doped polysilicon layer; and performing a second main etching step with a second pressure on the first remaining doped polysilicon layer and the second remaining doped polysilicon layer, wherein the second pressure is different from the first pressure.

2. The method of claim 1, wherein the first pressure is lower than the second pressure.

3. The method of claim 2, wherein the first pressure is less than about 10 mTorr.

4. The method of claim 2, wherein the second pressure is about 10 mTorr to 30 mTorr.

5. The method of claim 1, wherein the first main etching step is performed until each of the first remaining doped polysilicon layer and the second remaining doped polysilicon layer having a thickness of about 10% to 40% of an original thickness of the first doped polysilicon layer and the second doped polysilicon layer.

6. The method of claim 1, further comprising an over-etching step after the second main etching step.

7. The method of claim 6, wherein the over-etching step is performed with an etching pressure of about 30 mTorr to 60 mTorr and an etching time of about 50 seconds.

8. The method of claim 1, further comprising performing a breakthrough etching step before the first main etching step.

9. The method of claim 8, wherein the breakthrough etching is performed with a pressure of about 10 mTorr to 30 mTorr and a breakthrough time of about 30 seconds.

10. The method of claim 8, further comprising performing a bombardment step between the breakthrough etching step and the first main etching step.

11. The method of claim 10, wherein the bombardment step is performed with a $C_2F_6$ gas and a pressure of about 10 mTorr to 30 mTorr.

12. The method of claim 1, wherein the first main etching step and the second main etching step are performed with a gas mixture of $Cl_2$ and HBr.

13. The method of claim 1, wherein the first conductive type is N-type and the second conductive is type P-type.

14. The method of claim 1, wherein the first conductive type is P-type and the second conductive type is N-type.

15. A method of fabricating a dual gate, comprising the steps of: forming a gate oxide layer on a substrate;

forming a doped polysilicon layer on the gate oxide layer, wherein the doped polysilicon layer comprises a first doped polysilicon layer of a first conductive type and a second doped polysilicon layer of a second conductive type;

performing a first main etching step with a first pressure on the first doped polysilicon layer and the second doped polysilicon layer, so as to result in a first remaining doped polysilicon layer and a second remaining doped polysilicon layer; and performing a second main etching step with a second pressure on the first remaining doped polysilicon layer and the second remaining doped polysilicon layer to form a first doped polysilicon gate and a second doped polysilicon gate, wherein the second pressure is different from the first pressure.

16. The method of claim 15, wherein the first pressure is lower than the second pressure.

17. The method of claim 15, wherein the first pressure is less than about 10 mTorr.

18. The method of claim 15, wherein the second pressure is about 10 mTorr to 30 mTorr.

19. The method of claim 15, wherein the first main etching step is performed until each of the first remaining doped polysilicon layer and the second remaining doped polysilicon layer is about 10% to 40% of an original thickness of the first doped polysilicon layer and the second doped polysilicon layer.

20. The method of claim 15, further comprising an over-etching step after the second main etching step.

21. The method of claim 20, wherein the over-etching step is performed with an etching pressure of about 30 mTorr to 60 mTorr and an etching time of about 50 seconds.

22. The method of claim 15, further comprising performing a breakthrough etching step before the first main etching step.

23. The method of claim 22, wherein the breakthrough etching is performed with a pressure of about 10 mTorr to 30 mTorr and a breakthrough time of about 30 seconds.

24. The method of claim 22, wherein further comprising performing a bombardment step between the breakthrough etching step and the first main etching step.

25. The method of claim 24, wherein the bombardment step is performed with a $C_2F_6$ gas and a pressure of about 10 mTorr to 30 mTorr.

26. The method of claim 15, wherein the first main etching step and the second main etching step is performed with a gas mixture of $Cl_2$ and HBr.

* * * * *